United States Patent
Lei et al.

(10) Patent No.: US 10,269,747 B2
(45) Date of Patent: Apr. 23, 2019

(54) SEMICONDUCTOR DEVICES, METHODS OF MANUFACTURE THEREOF, AND PACKAGED SEMICONDUCTOR DEVICES

(71) Applicant: Taiwan Semiconductor Manufacturing Company, Ltd., Hsin-Chu (TW)

(72) Inventors: Yi-Yang Lei, Taichung (TW); Szu-Yu Yeh, Hsinchu County (TW); Yu-Ren Chen, Taichung (TW); Hung-Jui Kuo, Hsinchu (TW); Chung-Shi Liu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 56 days.

(21) Appl. No.: 13/660,867

(22) Filed: Oct. 25, 2012

(65) Prior Publication Data

US 2014/0117533 A1    May 1, 2014

(51) Int. Cl.
*H01L 23/00* (2006.01)
*H01L 23/31* (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 23/3128* (2013.01); *H01L 24/16* (2013.01); *H01L 24/32* (2013.01); *H01L 24/73* (2013.01); *H01L 24/81* (2013.01); *H01L 2224/0346* (2013.01); *H01L 2224/0361* (2013.01); *H01L 2224/03462* (2013.01); *H01L 2224/03622* (2013.01); *H01L 2224/03912* (2013.01); *H01L 2224/0401* (2013.01); *H01L 2224/05011* (2013.01); *H01L 2224/05017* (2013.01);

(Continued)

(58) Field of Classification Search
CPC ......... H01L 2224/04; H01L 2224/0401; H01L 2224/05017; H01L 2224/05557; H01L 24/04; H01L 24/05; H01L 24/06; H01L 2224/05011; H01L 2224/05018; H01L 2224/05551; H01L 2224/05558; H01L 2224/1357; H01L 2224/13688
USPC .......... 257/737, 780, 781; 438/108, 612–614
See application file for complete search history.

(56) References Cited

U.S. PATENT DOCUMENTS 6,194,243 B1 * 2/2001 Akram et al. .................. 438/51
6,400,021 B1    6/2002 Cho
(Continued)

FOREIGN PATENT DOCUMENTS

CN    101859733 A    10/2010
KR    20060048365 A    5/2006

*Primary Examiner* — Bryan R Junge
(74) *Attorney, Agent, or Firm* — Slater Matsil, LLP

(57) ABSTRACT

Semiconductor devices, methods of manufacture thereof, and packaged semiconductor devices are disclosed. In one embodiment, a method of manufacturing a semiconductor device includes forming a plurality of contact pads over a substrate, and forming an insulating material over the plurality of contact pads and the substrate. The insulating material is patterned to form an opening over each of the plurality of contact pads, and the plurality of contact pads is cleaned. The method includes forming an under-ball metallization (UBM) structure over the plurality of contact pads and portions of the insulating material. Cleaning the plurality of contact pads recesses a top surface of each of the plurality of contact pads.

21 Claims, 12 Drawing Sheets

(52) U.S. Cl.
CPC ............... *H01L 2224/05568* (2013.01); *H01L 2224/05572* (2013.01); *H01L 2224/05582* (2013.01); *H01L 2224/05583* (2013.01); *H01L 2224/05624* (2013.01); *H01L 2224/05647* (2013.01); *H01L 2224/05655* (2013.01); *H01L 2224/05666* (2013.01); *H01L 2224/05681* (2013.01); *H01L 2224/1147* (2013.01); *H01L 2224/11622* (2013.01); *H01L 2224/13007* (2013.01); *H01L 2224/13023* (2013.01); *H01L 2224/13082* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13562* (2013.01); *H01L 2224/13611* (2013.01); *H01L 2224/13647* (2013.01); *H01L 2224/13655* (2013.01); *H01L 2224/13687* (2013.01); *H01L 2224/16225* (2013.01); *H01L 2224/32225* (2013.01); *H01L 2224/73204* (2013.01); *H01L 2224/81805* (2013.01); *H01L 2924/00014* (2013.01); *H01L 2924/01322* (2013.01); *H01L 2924/15311* (2013.01); *H01L 2924/181* (2013.01)

(56) References Cited

U.S. PATENT DOCUMENTS

| | | | | |
|---|---|---|---|---|
| 6,444,561 | B1* | 9/2002 | Wang | H01L 21/4853 257/E21.508 |
| 6,674,017 | B1* | 1/2004 | Yamasaki | H05K 3/421 174/262 |
| 6,908,311 | B2* | 6/2005 | Ono et al. | 439/65 |
| 7,871,917 | B2* | 1/2011 | Fujimori | 438/613 |
| 2002/0111009 | A1* | 8/2002 | Huang et al. | 438/613 |
| 2005/0104188 | A1* | 5/2005 | Coolbaugh et al. | 257/690 |
| 2006/0087039 | A1* | 4/2006 | Cheng et al. | 257/750 |
| 2007/0123020 | A1* | 5/2007 | Jungnickel | H01L 24/11 438/612 |
| 2009/0243098 | A1* | 10/2009 | Farooq | H01L 24/11 257/738 |
| 2011/0049675 | A1* | 3/2011 | Nagai et al. | 257/532 |
| 2011/0186987 | A1* | 8/2011 | Wang | H01L 23/3171 257/737 |
| 2012/0025371 | A1* | 2/2012 | Matsui | H01L 23/3192 257/737 |
| 2012/0091577 | A1* | 4/2012 | Hwang et al. | 257/737 |

* cited by examiner

SEMICONDUCTOR DEVICES, METHODS OF MANUFACTURE THEREOF, AND PACKAGED SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packages (WLPs), in which integrated circuit dies are packaged in packages that typically include a redistribution layer (RDL) that is used to fan out wiring for contact pads of the integrated circuit die so that electrical contact can be made on a larger pitch than contact pads of the die. Flip chip packages are one type of WLP that are often used to package integrated circuit dies.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices and methods for semiconductor devices. Other embodiments are related to semiconductor devices and methods of manufacturing thereof. Novel semiconductor devices, methods of manufacture thereof, and packaged semiconductor devices will be described herein.

Figure 1:
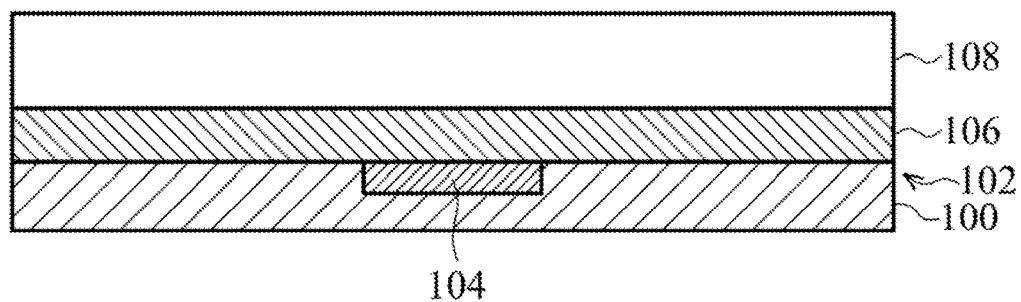
FIGS. 1 through 10 are cross-sectional views illustrating a method of manufacturing a semiconductor device at various stages in accordance with some embodiments of the present disclosure.
Figure 8:
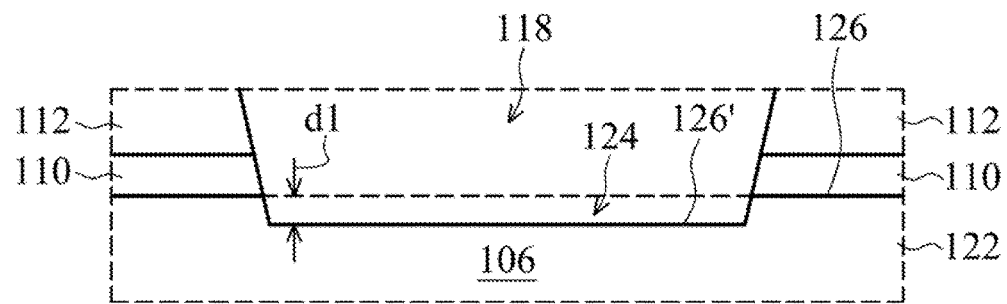
Figure 9:
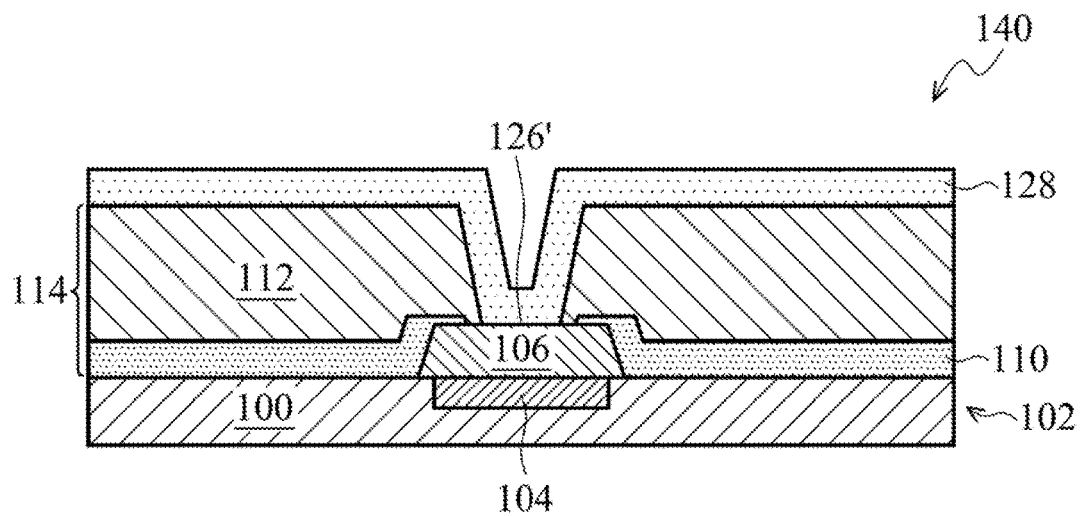
Figure 10:
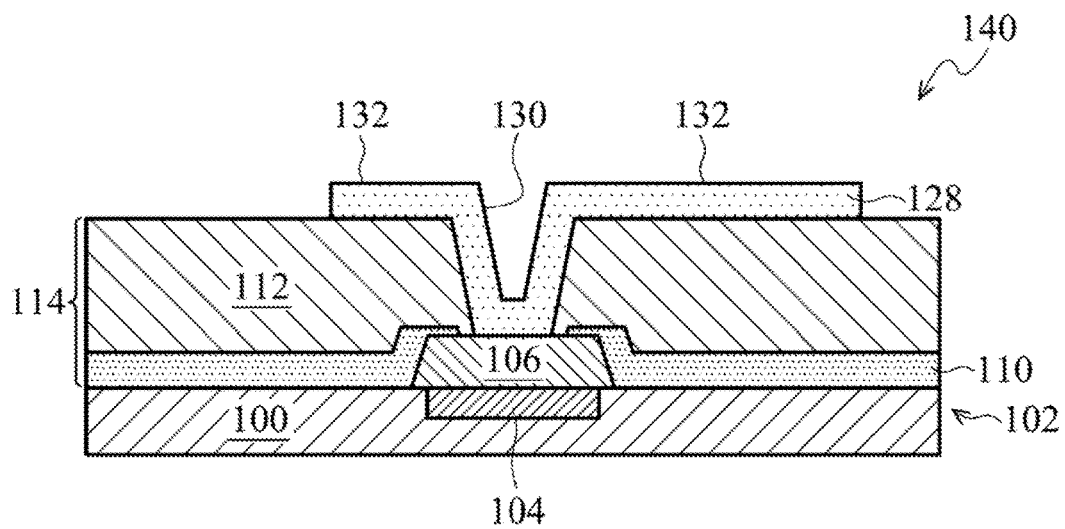

FIGS. 1 through 10 are cross-sectional views illustrating a method of manufacturing a semiconductor device 140 (not shown in FIG. 1: a completed semiconductor device 140 is shown in FIG. 10) in accordance with some embodiments of the present disclosure. Referring first to FIG. 1, there is shown a cross-sectional view of a substrate 100. The substrate 100 comprises a silicon interposer substrate in some embodiments. The substrate 100 comprises an integrated circuit with active circuitry formed thereon in other embodiments. The active circuitry may comprise a plurality of devices such as transistors, diodes, resistors, capacitors, inductors, and other elements formed across a surface thereof. Alternatively, the substrate 100 may comprise other materials and types of substrates. The substrate 100 may include a plurality of through-substrate vias (TSVs) comprising a conductive material formed therein, not shown, that provide vertical electrical connections for the semiconductor device 140. In some embodiments, the substrate 100 does not include TSVs. The substrate 100 comprises a semiconductor wafer or a portion of a semiconductor wafer in some embodiments. A plurality of semiconductor devices 140 will be formed across the surface of the substrate 100, and the substrate 100 will later be singulated, either before or after the semiconductor devices 140 are packaged or are used as packaging devices. In the embodiments shown in FIGS. 1 through 12, the semiconductor device 140 comprises a packaging device that includes a substrate 100 comprising a packaging substrate.

The substrate 100 includes a conductive material layer 102 disposed proximate a top surface thereof. The conductive material layer 102 includes a plurality of conductive features 104 formed within an insulating material (not shown). Only one conductive feature 104 is shown in FIGS. 1 through 10; however, a plurality of conductive features 104 is formed across the surface of the substrate 100 within the conductive material layer 102 in accordance with some embodiments. The conductive features 104 comprise Cu, a Cu alloy, other conductive materials, or combinations and/or multiple layers thereof, as examples. The conductive features 104 comprise at least a portion of a redistribution layer (RDL) for the semiconductor device 140 in some embodiments. The RDL may comprise horizontal connections for the semiconductor device 140, for example. Alternatively, the substrate 100 may not include an RDL, in other embodiments. The conductive material layer 102 comprises upper metallization layers of the substrate 100 in some embodiments, for example.

A contact pad material 106 is formed over the substrate 100, also shown in FIG. 1. The contact pad material 106 comprises aluminum or an aluminum alloy in some embodiments. Alternatively, the contact pad material 106 may comprise other materials. The contact pad material 106 comprises a thickness of about 10,000 Å to about 30,000 Å in some embodiments. Alternatively, the contact pad material 106 may comprise other dimensions.

Figure 2:
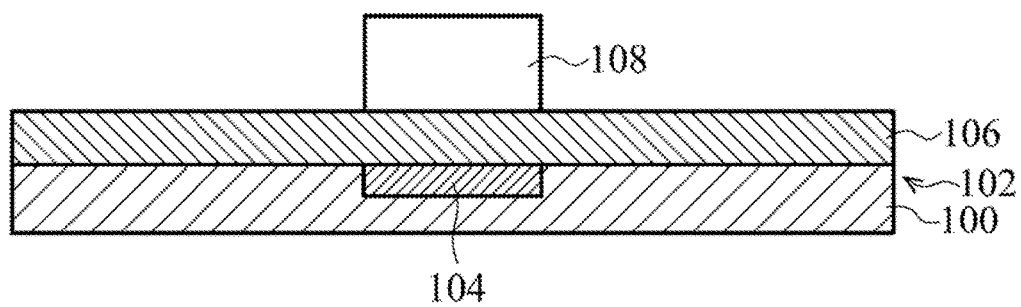
Figure 3:
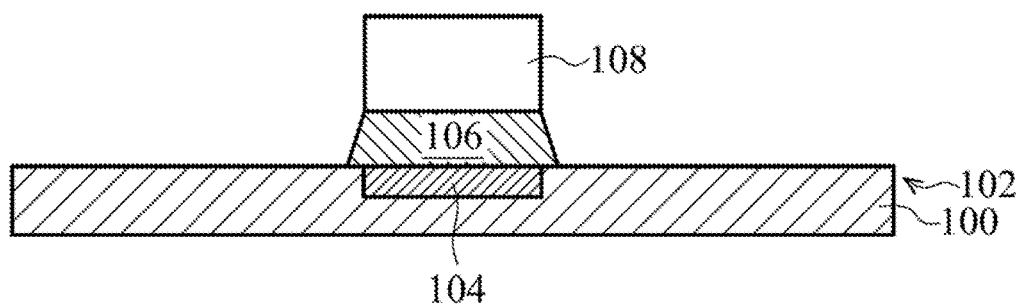

The contact pad material 106 is patterned using lithography to form contact pads 106, as shown in FIGS. 1, 2, and 3. An example of a lithography process that can be used to pattern the contact pad material 106 is illustrated. A photoresist 108 is formed or deposited over the contact pad material 106, as shown in FIG. 1. The photoresist 108 is patterned using lithography, by exposing portions of the photoresist 108 to light or energy reflected from or transmitted through a lithography mask having a desired pattern thereon. Exposed or unexposed portions (depending on whether the photoresist 108 is positive or negative) are developed and then etched or ashed away, leaving the patterned photoresist 108 shown in FIG. 2. The patterned photoresist 108 is then used as an etch mask while portions of the contact pad material 106 are etched away using an etch process, leaving contact pads 106 formed over the substrate 100, as shown in FIG. 3. Sidewalls of the contact pads 106 may be tapered outwardly at the bottom as illustrated in FIG. 3 due to the properties of the etch process chemistry and/or material of the contact pads 106 in some embodiments. Alternatively, the sidewalls of the contact pads 106 may be substantially vertical or under-etched, not shown.

Figure 4:
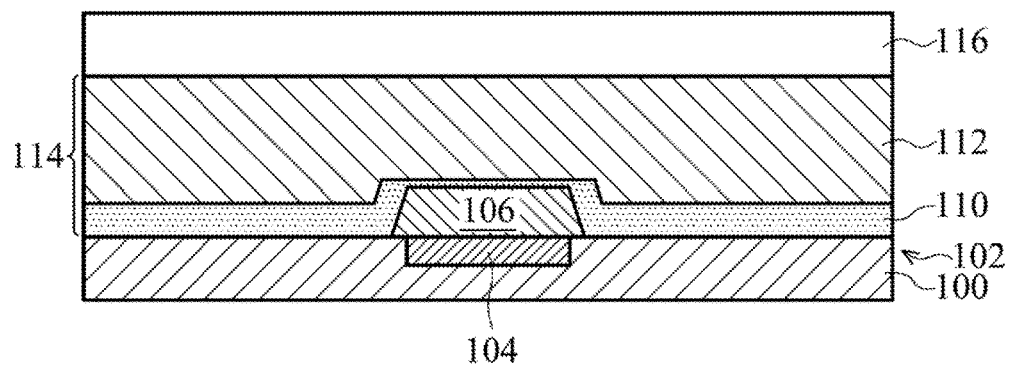

The photoresist 108 is removed, as shown in FIG. 4. The contact pads 106 are formed directly over or at least partially over conductive features 104 in the conductive material layer 102 of the substrate 100 in some embodiments. An insulating material 114 is then formed over the contact pads 106 and exposed portions of the substrate 100, also shown in FIG. 4. In some embodiments, the insulating material 114 comprises a first insulating material 110 and a second insulating material 112 disposed over the first insulating material 110. The first insulating material 110 comprises a passivation layer having a thickness of about 5,000 Å to about 15,000 Å in some embodiments. Alternatively, the first insulating material 110 may comprise other dimensions. The first insulating material 110 may comprise SiN, SiO, other insulators, or combinations or multiple layers thereof, as examples. Alternatively, the first insulating material 110 may comprise other materials.

The second insulating material 112 comprises a polymer in some embodiments. The second insulating material 112 comprises polyimide, other polymer dielectric materials, other insulators, or combinations or multiple layers thereof, as examples. Alternatively, the second insulating material 112 may comprise other materials. The second insulating material 112 comprises a thickness of about 3 µm to about 10 µm in some embodiments. The second insulating material 112 comprises a thickness of about 4 µm to about 8 µm in other embodiments. Alternatively, the second insulating material 112 may comprise other dimensions. In some embodiments, the insulating material 114 comprises a single material layer comprised of a material or materials described for the first and/or second insulating material 110 and 112, as another example.

Figure 5:
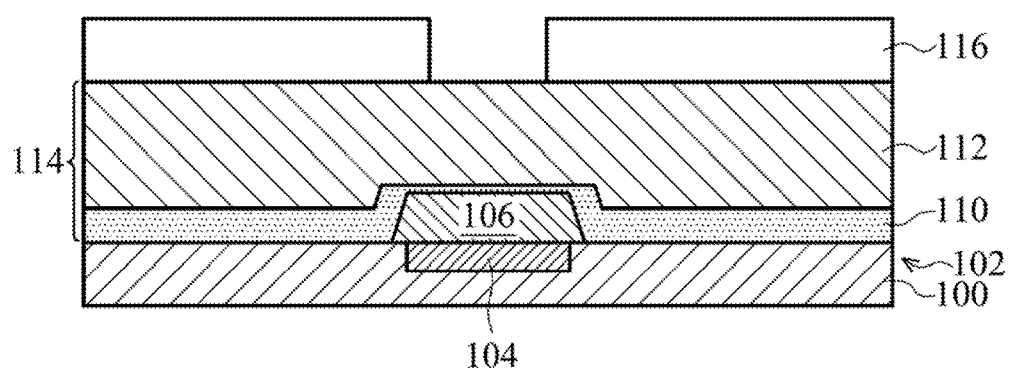
Figure 6:
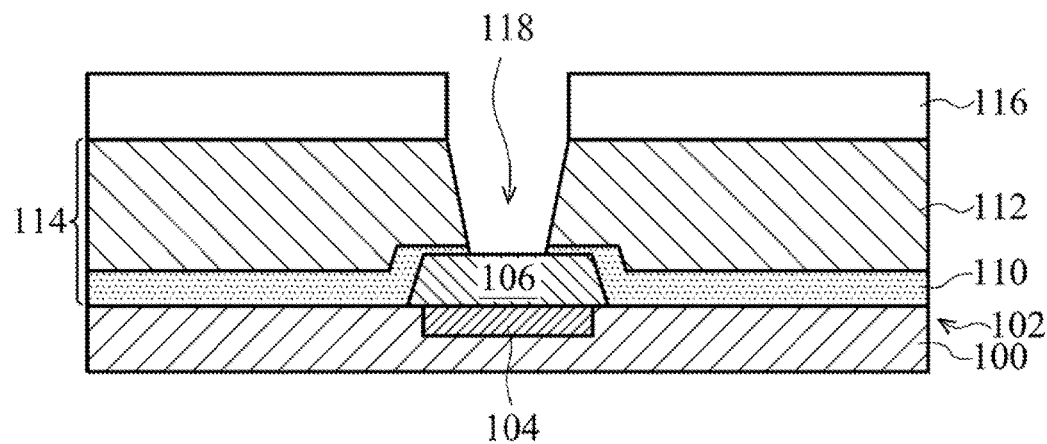
Figure 7:
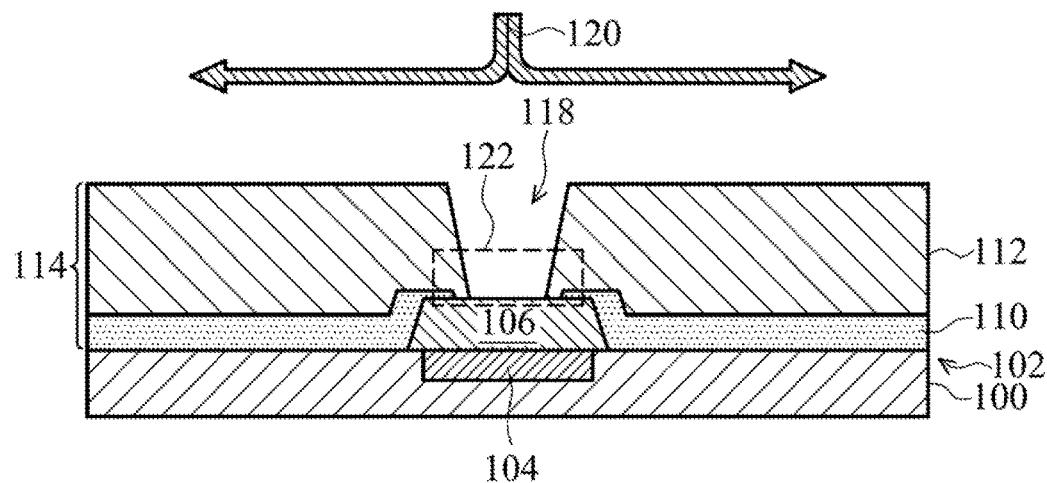

The insulating material 114 is then patterned using lithography, by forming a photoresist 116 over the insulating material 114 as shown in FIG. 4, patterning the photoresist 116 as shown in FIG. 5, and using the photoresist 116 as an etch mask during an etch process for the insulating material 114, removing portions of the insulating material 114 to form an opening 118 over each contact pad 106, as shown in FIG. 6. The photoresist 116 is then removed, as shown in FIG. 7. In some embodiments, a direct patterning method is used to pattern the insulating material 114 rather than using a photoresist 116, e.g., in embodiments wherein the insulating material 114 comprises a photosensitive material. The insulating material 114 is exposed and developed to pattern the insulating material 114 in these embodiments, for example.

In some embodiments, the insulating material 114 is cured at a temperature of about 300 to 400 degrees C. for about 1 to 2 hours, after patterning the insulating material 114. In embodiments wherein the insulating material 114 comprises a second insulating material 112 comprising a polymer, the curing process cures and hardens the second insulating material 112, for example. In other embodiments, a curing process is not included in the manufacturing process for the semiconductor device 140.

The patterning process for the insulating material 114 removes the insulating material 114 from over a portion of the top surface of the contact pad 106, exposing the contact pad 106 top surface, as illustrated in FIG. 7. An opening 118 in the insulating material 114 is formed over the top surface of each of the contact pads 106 formed across the surface of the substrate 100 in some embodiments. Each opening 118 in the insulating material 114 over the contact pads 106 comprises a width of about 100 µm or less in a top view of the semiconductor device 140 in some embodiments. In other embodiments, the openings 118 each comprise a width in a top view of about 50 µm or less, as another example. Each of the openings 118 comprises a round, oval, or polygon shape in a top view of the semiconductor device 140 in some embodiments, as examples. Alternatively, the openings 118 in the insulating material 114 may comprise other sizes and shapes.

In some embodiments, after the first insulating material 110 is deposited, the first insulating material 110 is patterned to remove the first insulating material 110 from over portions of the top surface of the contact pads 106. The second insulating material 112 is then deposited over the patterned first insulating material 110 and over exposed portions of the contact pads 106. The second insulating material 112 is then patterned. The openings in the first insulating material 110 may be larger than openings 118 in the second insulating material 112, as illustrated in FIGS. 7, 9, 10, and 11A, so that the openings 118 are only formed in the second insulating material 112. Alternatively, the openings 118 may be formed in both the first and second insulating materials 110 and 112 in other embodiments, as shown in FIGS. 6 and 11B, and in the more detailed view of FIG. 8.

Referring again to FIG. 7, in accordance with some embodiments of the present disclosure, the semiconductor device 140 is next subjected to a cleaning process 120. The cleaning process 120 cleans the exposed top surface of the contact pads 106 in preparation for the formation of an under-ball metallization (UBM) structure that will subsequently be formed over the contact pads 106 and the insulating material 114. The cleaning process 120 has no or little effect on the insulating material 114, yet forms recesses 124 (see FIG. 8) in the top surface of the contact pads 106, in some embodiments.

The cleaning process 120 for the contact pads 106 comprises a wet chemical cleaning process in some embodiments. The cleaning process 120 comprises an acidic solution in other embodiments. The acidic solution of the cleaning process 120 comprises hydrofluoric acid or phosphoric acid, although other acidic solutions may also be used. The acidic solution of the cleaning process 120 may comprise diluted hydrofluoric acid comprising a concentration of about 0.1% to about 10% combined with water, or diluted phosphoric acid comprising a concentration of about 1% to about 50% combined with water in some embodiments, as examples. Other concentrations of these and other acids may alternatively be used for the cleaning process 120 in other embodiments.

FIG. 8 is a more detailed cross-sectional view of region 122 of FIG. 7, illustrating a recess 124 that is formed on a portion of the top surface 126 of the contact pad 106 as a result of the cleaning process 120. In FIG. 8, the top surface 126' of the contact pad 106 in a central portion of the contact pad 106 is recessed from edge portions of the contact pad 106 which maintain the original level of the top surface 126 of the contact pad 106 after the cleaning process 120. The top surface 126' of the central portion of the contact pad 106 includes a recess 124 that is recessed from top surface 126 of edge portions of the contact pad 106 by dimension $d_1$. Dimension $d_1$ comprises about 400 Angstroms or greater in some embodiments, as an example. In some embodiments, dimension $d_1$ comprises about 600 Angstroms, as another example. Alternatively, dimension $d_1$ may comprise other values.

In the drawings, the openings 118 are formed over a central portion of the top surface of the contact pads 106. However, alternatively, due to misalignment of the various lithography processes used to pattern the various material layers, the openings 118 may be formed on one side or edge portion of a top surface of the contact pads 106, not shown in the drawings. In some embodiments, the openings 118 may overlap over a top edge of a top surface of the contact pads 106, also not shown in the drawings. However, in accordance with some embodiments of the present disclosure, the openings 118 are formed over at least a portion of the top surface of the contact pads 106 so that electrical contact will be made to the contact pads 106 by the UBM structure 128 (see FIG. 10). The exposed portion of the top surface of the contact pads 106 are recessed by dimension $d_1$ by the cleaning process 120 in accordance with embodiments, for example. Thus, the contacts pads 106 have a top surface 126' and 126 after the cleaning process 120 that includes recessed portions (e.g., that have a top surface 126') and non-recessed portions (that have a top surface 126).

Next, shown in FIG. 9, a UBM material 128 is formed over the patterned insulating material 114 and top surfaces 126' of the contact pads 106 comprising the recess 124 (the recess 124 is not shown in FIG. 9; see FIG. 8). The UBM material 128 comprises a metal in some embodiments that is formed using a sputter process. The UBM material 128 comprises a single material or a plurality of material layers. In some embodiments, the UBM material 128 comprises a plurality of layers comprising a material stack of two or more material layers. The UBM material 128 comprises a thickness of about 100 to 10,000 Angstroms in some embodiments, although alternatively, the UBM material 128 may comprise other dimensions.

The UBM material 128 may comprise Ti/Cu, TiN/Cu, TaN/Cu, TiW/Cu, Ti/NiV/Cu, Ti/NiSi/Cu, Al/NiV/Cu, Al/NiSi/Cu, or multiple layers or combinations thereof, as examples. Each material stack in the example list of materials is listed in the order of the deposition process. As one example, a UBM material 128 comprising Ti/Cu comprises a first layer of Ti formed over the insulating material 114 and contact pad 106, and a second layer of Cu formed over the first layer of Ti. As another example, a UBM material 128 comprising Ti/NiV/Cu comprises a first layer of Ti formed over the insulating material 114 and contact pad 106, a second layer of NiV formed over the first layer of Ti, and a third layer of Cu formed over the second layer of NiV. In some embodiments, the top layer of the UBM material 128 comprises Cu, which is an excellent conductor with a low resistance, for example. Alternatively, the top layer of the UBM material 128 may comprise other materials, and other material systems, combinations, and multiple layers may be used for the UBM material 128.

The UBM material 128 is patterned using lithography or other type of patterning process to form a UBM structure 128, as shown in FIG. 10. The UBM structure 128 includes regions 130 for the formation of conductive bumps and regions 132 that comprise traces of conductive wiring. In some embodiments and/or in some regions of the semiconductor device 140, the UBM structure 128 includes the conductive bump formation regions 130 and does not include the trace regions 128, as another example.

The semiconductor device 140 shown in FIG. 10 includes the substrate 100, a plurality of the contact pads 106, the insulating material 114, and the UBM structure 128 formed over and electrically coupled to the contact pads 106 having the recess 124 (see FIG. 8) formed on a portion of the top surface 126 thereof.

Figure 11A:
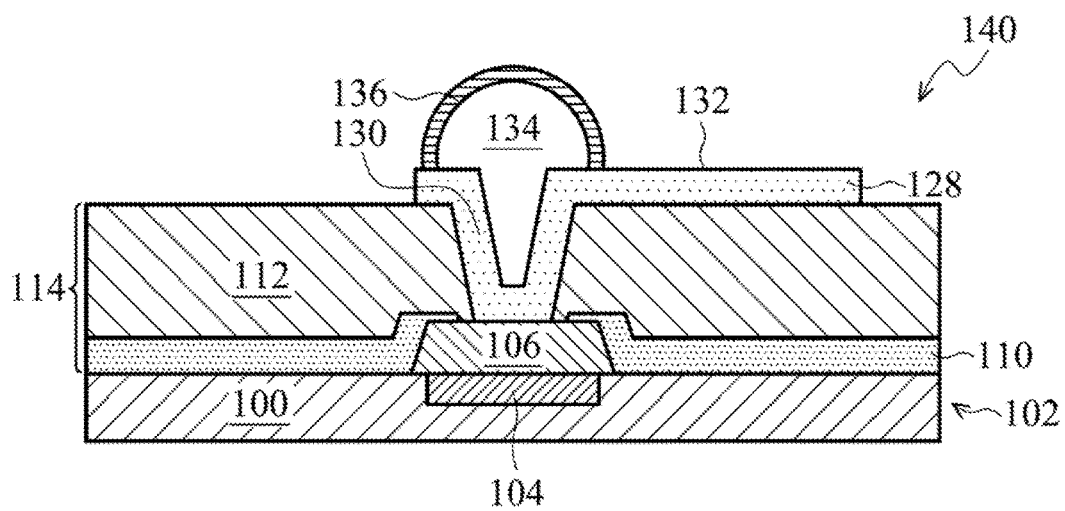
FIG. 11A is a cross-sectional view showing a conductive bump coupled to an under-ball metallization (UBM) structure of the semiconductor device shown in FIG. 10 in accordance with some embodiments.
Figure 11B:
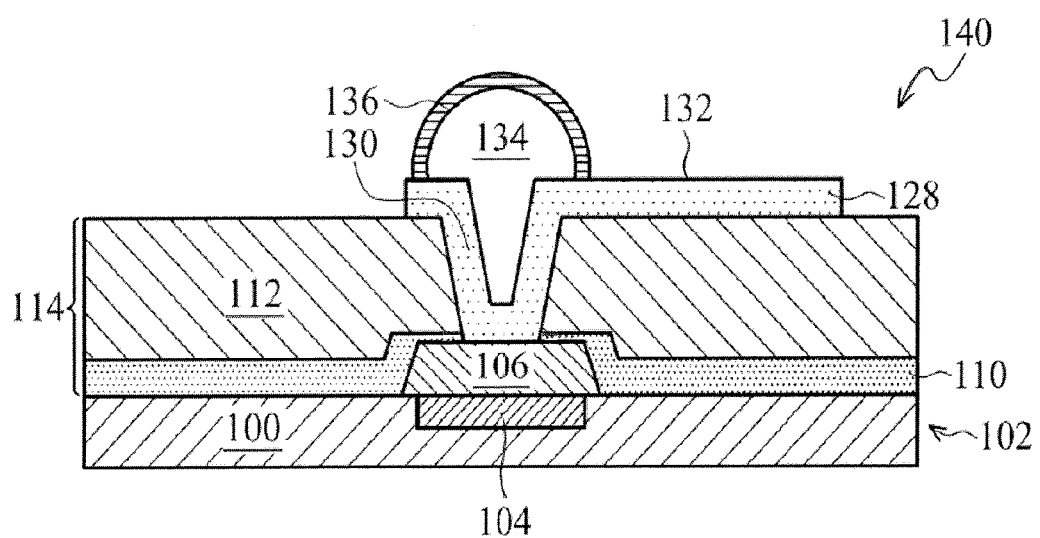
FIG. 11B is a cross-sectional view showing a conductive bump coupled to an under-ball metallization (UBM) structure of the semiconductor device shown in FIGS. 6 and 8 in accordance with some embodiments.

In some embodiments, a conductive bump 134 is coupled to the UBM structure 128 over each contact pad 106, as shown in FIGS. 11A and 11B. A conductive bump 134 is formed on each conductive bump formation region 130 of the UBM structure 128. The conductive bumps 134 may comprise copper, nickel, or tin or a tin alloy, and/or combinations thereof, as examples, although alternatively, the conductive bumps 134 may comprise other materials. The conductive bumps 134 may include a metal oxide layer 136 disposed on a surface thereof in some embodiments. The metal oxide layer 136 may comprise copper oxide, nickel oxide, or tin oxide, e.g., in embodiments wherein the conductive bumps 134 comprise copper, nickel, or tin or a tin alloy, respectively, as examples. The metal oxide layer 136 may comprise a thickness of about 5 Å to about 1,000 Å, for example. Alternatively, the metal oxide layer 136 may comprise other materials and dimensions, and the metal oxide layer 136 may not be included.

Each conductive bump 134 may comprise a copper bump, a copper bump with a cap layer 138 (not shown in FIGS. 11A and 11B; see FIG. 17) disposed thereon, a solder bump, or other types of bumps, as examples. The conductive bumps 134 may comprise copper bumps that comprise copper or a copper alloy, for example. The copper bumps comprise copper pillars in some embodiments, as another example. The conductive bumps 134 may comprise copper bumps with a cap layer 138 disposed thereon, wherein the cap layer 138 comprises a material such as Sn, Ni, Sn/Ag, Sn/Cu, Sn/Ag/Cu, Sn/Pb, Au, Ag, Pd, or combinations or multiple layers thereof, in some embodiments. The cap layer 138 may comprise a solder cap layer in some embodiments, for example. The conductive bumps 134 may comprise solder bumps, comprising a material such as Sn, Sn/Ag, Sn/Cu, Sn/Ag/Cu, Sn/Pb, Au, Ag, Pd, or combinations or multiple layers thereof, in some embodiments. Alternatively, the conductive bumps 134 and the cap layer 138 may comprise other materials.

The conductive bumps 134 may comprise a diameter of about 5 μm to about 150 μm, as an example. Alternatively, the width or diameter of the conductive bumps 134 may comprise other dimensions. In some embodiments, each of the conductive bumps 134 is spaced apart from an adjacent conductive bump 134 by about 150 μm or less. The plurality of conductive bumps 134 may be positioned on a pitch of about 150 μm or less, for example. The conductive bumps 134 may be arranged in an array, in one or more rows, or in random patterns, as examples, on the surface of the semiconductor device 140 comprising a packaging device and/or integrated circuit die 150. Alternatively, the conductive bumps 134 of the semiconductor device 140 may be spaced apart by other dimensions and may comprise other configurations.

The conductive bumps 134 may be formed on the UBM structure 128 using a ball drop process or other bumping process, as examples. The conductive bumps 134 may alternatively be formed using a plating process, to be described further herein with reference to FIGS. 13 through 19.

The semiconductor device 140 comprises a packaging device in accordance with some embodiments. The packaging device can be used to package an integrated circuit die by coupling the integrated circuit die to the conductive bumps 134 of the semiconductor device 140. In other embodiments, the semiconductor device 140 comprises an integrated circuit die. The integrated circuit die can be packaged using a packaging device by "flipping" or inverting the integrated circuit die and coupling the conductive bumps 134 of the semiconductor device 140 to a top surface of the packaging device.

Figure 12:
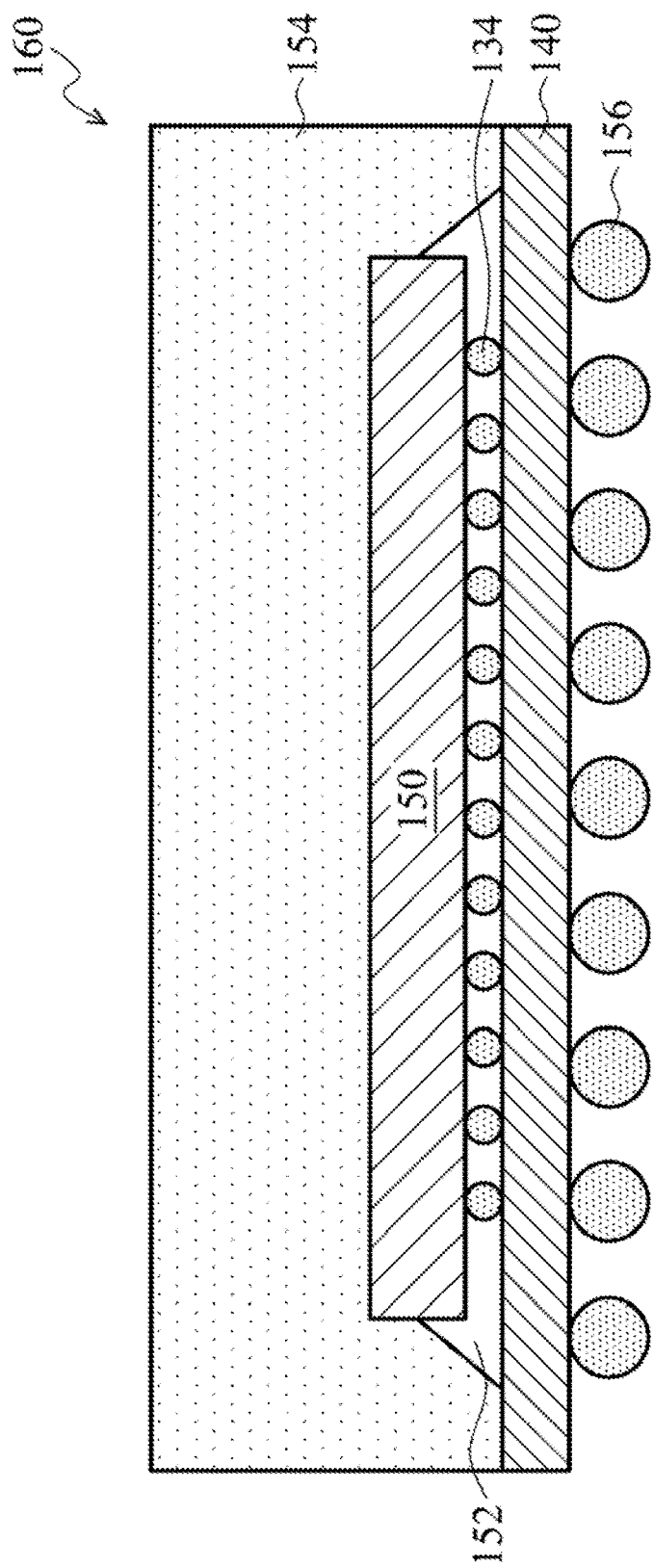
FIG. 12 is a cross-sectional view of a packaged semiconductor device that includes a semiconductor device shown in FIG. 10 in accordance with some embodiments.

For example, FIG. 12 is a cross-sectional view of a packaged semiconductor device 160 that includes a semiconductor device 140 shown in FIG. 10 that comprises a packaging device in accordance with some embodiments. The details of the semiconductor device 140 comprising the packaging device are not shown in FIG. 12; refer again to FIGS. 8, 11A, and 11B for the detailed elements of the semiconductor device 140.

An integrated circuit die 150 is provided and is coupled to the semiconductor device 140 comprising a packaging device using a flip chip process and configuration in some embodiments, as shown in FIG. 12. Alternatively, other WLP processes and configurations may be used. The integrated circuit die 150 comprises semiconductor circuitry that may be formed over a semiconductor substrate comprising silicon or other semiconductor materials. The integrated circuit die 150 may include active components or circuits, not shown, that may comprise transistors, diodes, capacitors, resistors, inductors, and/or other devices. The integrated circuit die 150 may comprise a memory device, a logic device, or other types of circuits, as examples.

The integrated circuit die 150 is coupled to the semiconductor device 140 comprising a packaging device by a plurality of the conductive bumps 134 disposed on the semiconductor device 140 comprising a packaging device. A eutectic material of the conductive bumps 134 is heated above the melting temperature of the eutectic material, to re-flow the material of the conductive bumps 134. The eutectic material of the conductive bumps 134 is cooled until the bumps 134 comprise a solid conductive material, providing mechanical and electrical attachment of the integrated circuit die 150 to the semiconductor device 140 comprising a packaging device.

An underfill material 152 can be dispensed beneath the integrated circuit die 150, and a molding compound 154 can be formed over the integrated circuit die 150, the underfill material 152, and exposed portions of the semiconductor device 140 comprising a packaging device. The underfill material 152 comprises an insulator such as a polyimide, and the molding compound 154 comprises an insulator such as polyimide, epoxy, acrylate, or silica in some embodiments, as examples. Alternatively, the underfill material 152 and molding compound 154 may comprise other materials, and the underfill material 152 and/or the molding compound 154 may not be included on the packaged semiconductor device 160, in some embodiments. A chemical mechanical polishing (CMP) process, an etch process, or a combination thereof, can used to remove portions of the molding compound 154 from over the top surface of the integrated circuit die 150 in some embodiments, not shown.

In some embodiments, a plurality of conductive balls 156 comprising solder or other eutectic material is coupled to contact pads (not shown) on a bottom surface of the semiconductor device 140 comprising a packaging device. The packaged semiconductor device 160 can be coupled to another packaged semiconductor device, to a printed circuit board (PCB), or other device in an end application using the conductive balls 156, for example. Alternatively, the conductive balls 156 may not be included, and the packaged semiconductor device 160 may be coupled to another device using other methods.

Figure 13:
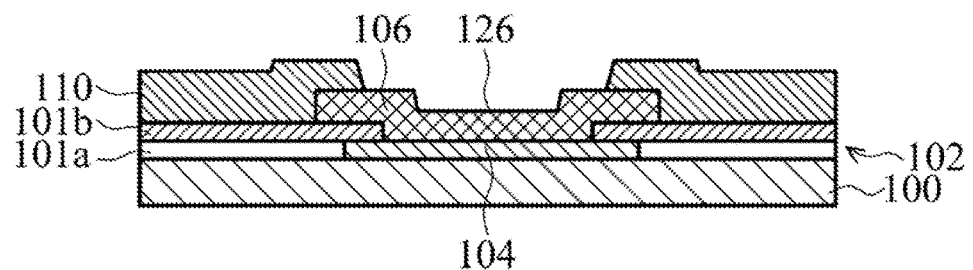
FIGS. 13 through 19 are cross-sectional views illustrating a method of manufacturing a semiconductor device in accordance with some embodiments.

FIGS. 13 through 19 are cross-sectional views illustrating a method of manufacturing a semiconductor device 140 in accordance with other embodiments, wherein the conductive bumps 134 are formed using a plating process. Referring next to FIG. 13, the substrate 100 is provided, wherein the substrate 100 includes an integrated circuit die. The integrated circuit die of the substrate 100 comprises semiconductor circuitry that may be formed over a semiconductor substrate comprising silicon or other semiconductor materials. The integrated circuit die may include active components or circuits, not shown, that may comprise transistors, diodes, capacitors, resistors, inductors, and/or other devices. The integrated circuit die may comprise a memory device, a logic device, or other types of circuits, as examples.

The integrated circuit die of the substrate 100 includes conductive features 104 formed in one or more insulating material layers 101a and 101b. The conductive features 104 may comprise conductive lines formed in an upper metallization layer of the substrate 100, for example. The insulating material layers 101a and 101b may comprise silicon dioxide, silicon nitride, other insulators, and/or combinations or multiple layers thereof, as examples. Contact pads 106 are formed in a first insulating material 110 disposed over insulating material layer 101b and also in insulating material 101b. The contact pad 106 is disposed over the conductive feature 104. The contact pad 106 comprises a topography that conforms to patterns in the insulating material layer 101b over the conductive feature 104, and portions of the first insulating material 110 have a topography that conforms to the topography of the contact pad 106 in the embodiments shown in FIGS. 13 through 18.

Figure 14:
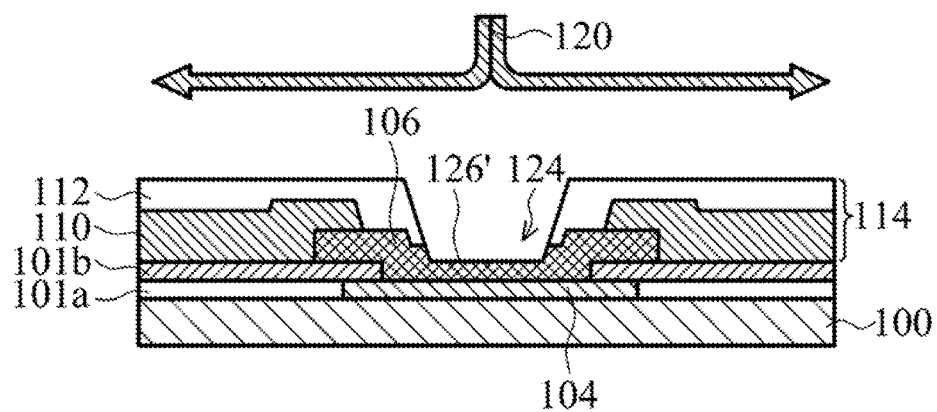
Figure 15:
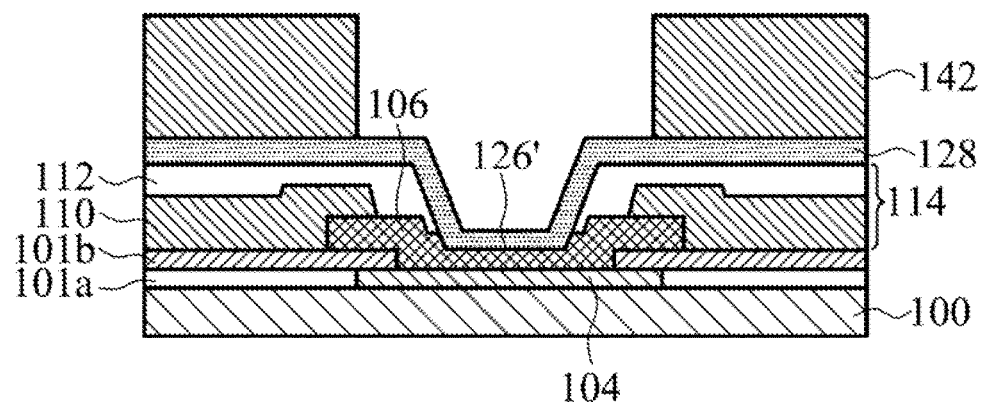

Referring next to FIG. 14, the second insulating material 112 is formed over the contact pad 106 and the first insulating material 110, and the second insulating material 112 is patterned and cured. The top surface 126 of the contact pad 106 is cleaned using a cleaning process 120, resulting in a recessed top surface 126' of the contact pad 106. A UBM material 128 is formed over the patterned second insulating material 112 and recessed top surface 126' of the contact pad 106, as shown in FIG. 15. A layer of photoresist 142 is formed over the UBM material 128, also shown in FIG. 15. The layer of photoresist 142 is patterned by exposure and development using a photolithography process.

Figure 16:
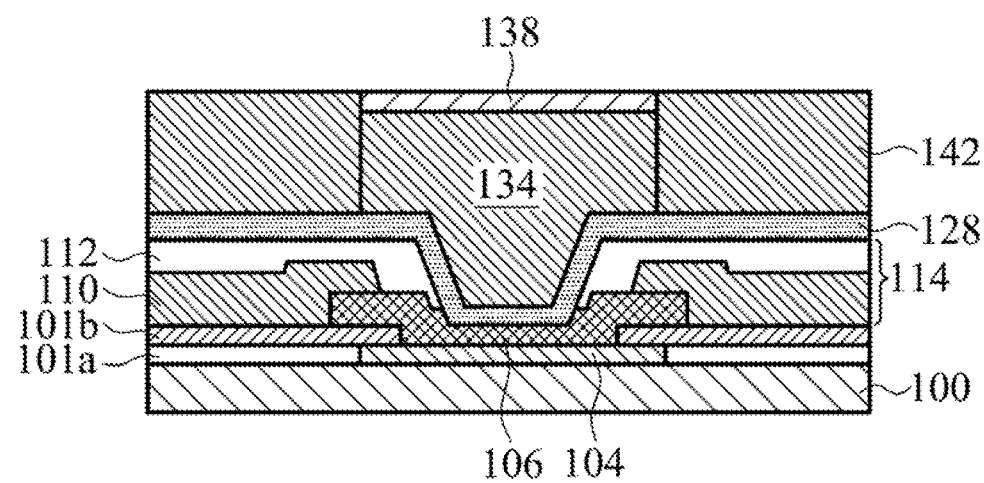
Figure 17:
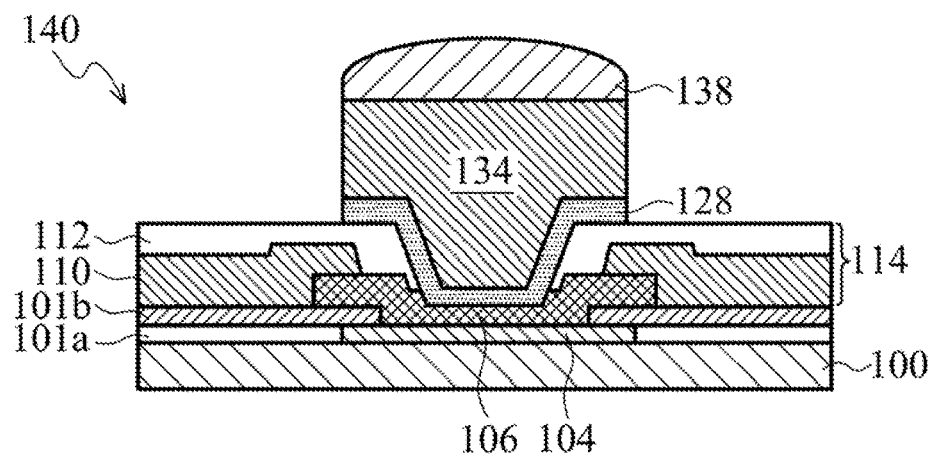

Conductive bumps 134 are formed over the exposed UBM material 128 using a plating process, as shown in FIG. 16. The plating process comprises an electrochemical plating process in some embodiments, although alternatively, other types of plating processes may be used. The conductive bumps 134 include a cap layer 138 that can be plated on or deposited in the embodiment shown. The cap layer 138 may comprise solder or other materials described previously herein. The layer of photoresist 142 is then removed, as shown in FIG. 17, and exposed portions of the UBM material 128 are etched away using an etch process, also shown in FIG. 17. The semiconductor device 140 can then be heated to reflow a material of the cap layer 138 in some embodiments, for example.

Figure 18:
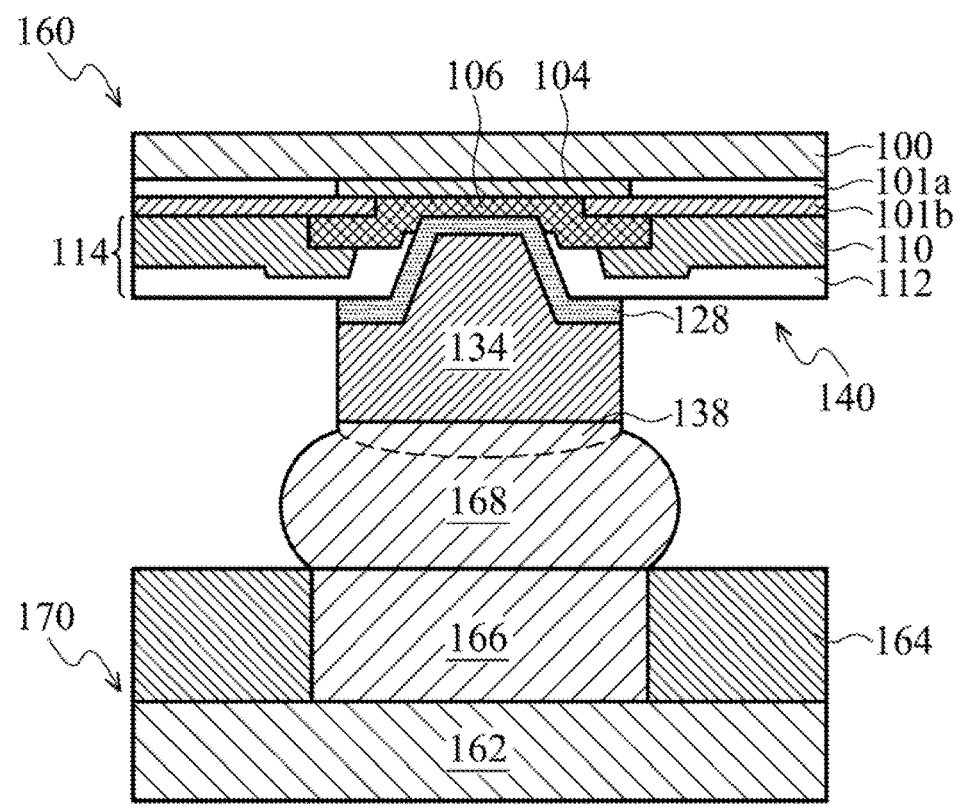

The semiconductor device 140 is "flipped" or inverted and attached to a packaging device 170 in some embodiments, as shown in FIG. 18. The packaging device 170 includes a substrate 162 which may comprise an interposer substrate or other types of substrates, with a plurality of conductive traces or features 166 disposed within an insulating material 164 proximate a top surface thereof. Solder balls 168 may be formed using a pre-solder process on top surfaces of the conductive traces or features 166 of the packaging device 170, in some embodiments. In other embodiments, the solder balls 168 are not included. Conductive bumps 134 are coupled to the solder balls 168 (or to the conductive traces or features 166 of the packaging device 170, if the solder balls 168 are not included), and the packaged device 160 is heated to reflow a eutectic material of the solder balls 168 and/or the cap layer 138 of the conductive bumps 134, attaching the semiconductor device 140 comprising the integrated circuit die to the packaging device 170 and forming a packaged semiconductor device 160.

Figure 19:
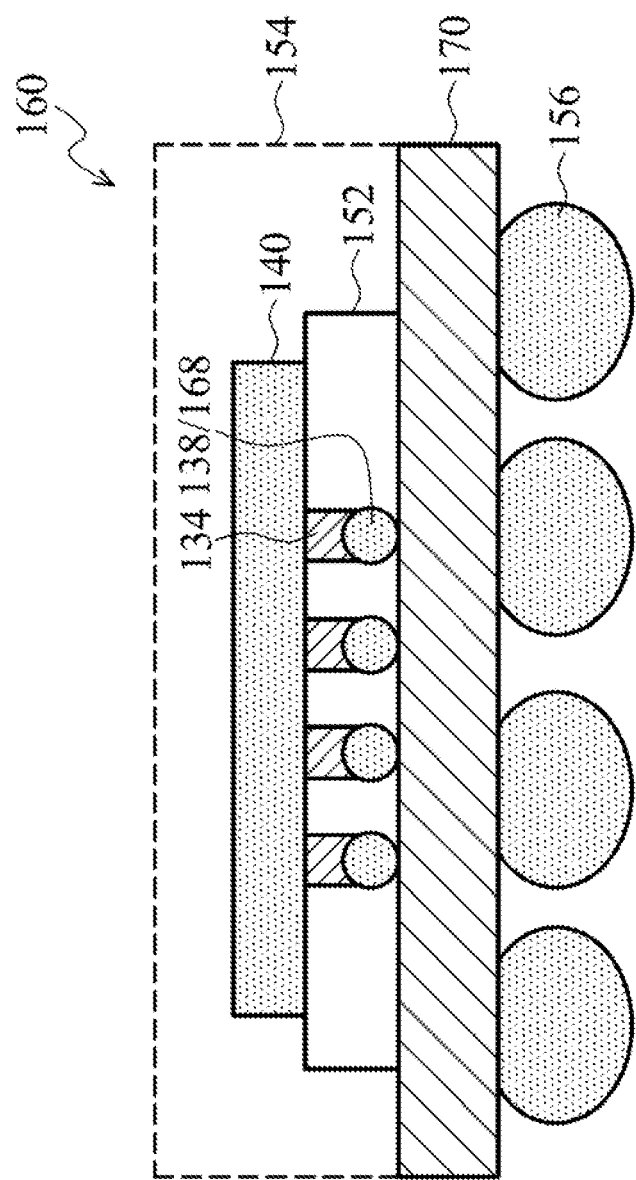

FIG. 19 illustrates a cross-sectional view of a packaged semiconductor device 160 after further processing. Similar to the embodiment shown in FIG. 12, an underfill material 152 is dispensed beneath the semiconductor device 140, a molding compound 154 can be formed over the semiconductor device 140 and the packaging device 160, as shown in phantom, and conductive balls 156 can be formed on a bottom surface of the packaging device 160.

The process flow illustrated in FIGS. 15 through 17 for forming the conductive bumps 134 using a plating process can also be used to manufacture a semiconductor device 140 comprising a packaging device. Likewise, the process flow illustrated in FIGS. 4 through 11A and 11B for forming a UBM structure 128 and conductive bumps 134 can also be used to manufacture a semiconductor device 140 comprising an integrated circuit die. Two semiconductor devices 140 described herein can be packaged together in accordance with some embodiments, wherein one semiconductor device 140 comprises an integrated circuit die, and the other semiconductor device 140 comprises a packaging device, for example.

Figure 20:
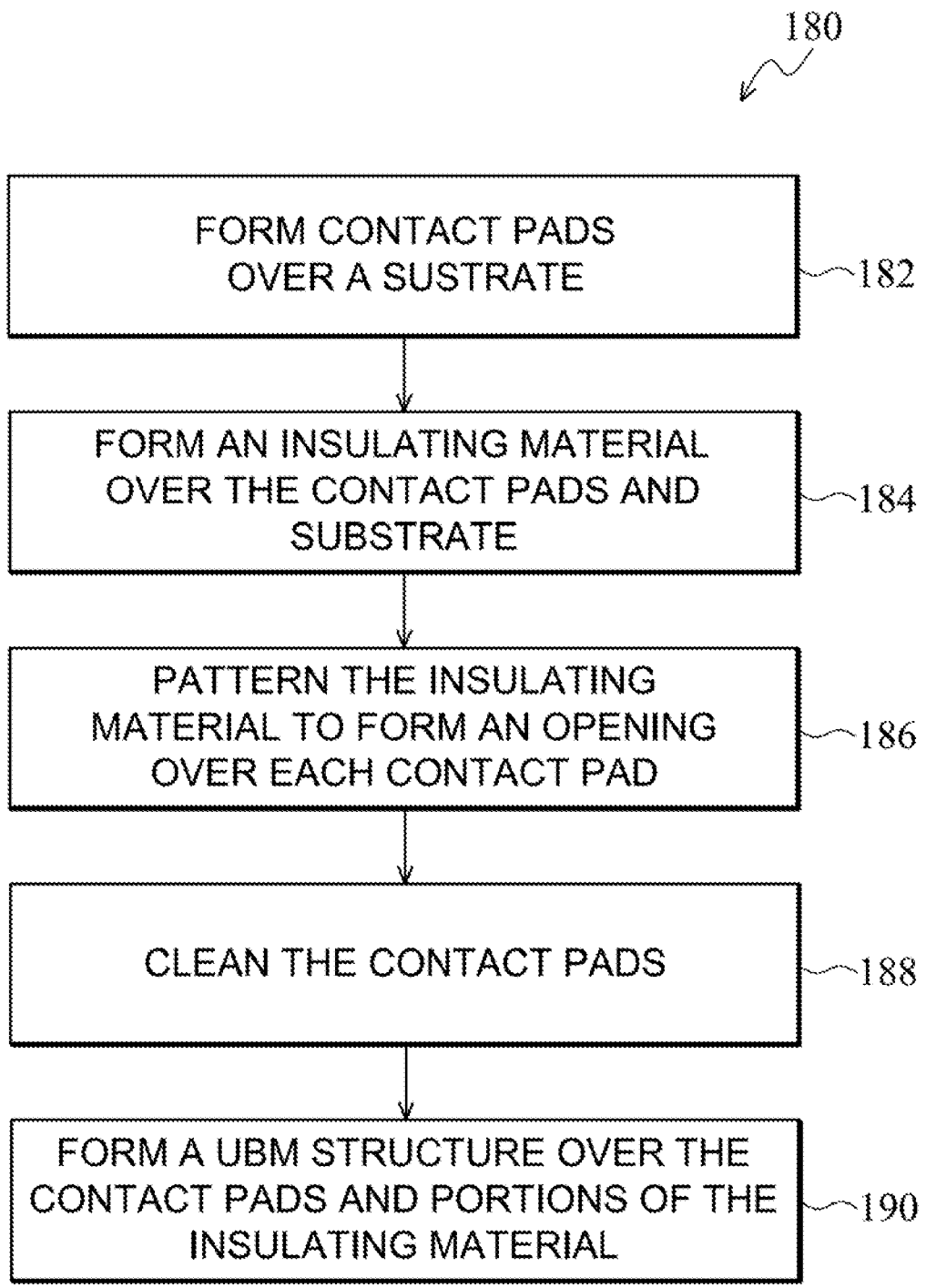
FIG. 20 is a flow chart of a method of manufacturing a semiconductor device in accordance with some embodiments.

FIG. 20 is a flow chart 180 of a method of manufacturing a semiconductor device 140 in accordance with some embodiments. In step 182, contact pads 106 are formed over a substrate 100. In step 184, an insulating material 114 is formed over the contact pads 106 and the substrate 100. In step 186, the insulating material 114 is patterned to form an opening 118 over each contact pad 106. In step 188, the contact pads 106 are cleaned using the cleaning process 120 described with reference to FIG. 7 or FIG. 14 which forms a recess 124 in a portion of the top surface of the contact pads 106. In step 190, a UBM structure 128 is formed over each of the contact pads 106 and portions of the insulating material 114.

Some embodiments of the present disclosure include methods of manufacturing semiconductor devices 140, and also include semiconductor devices 140 manufactured using the methods described herein. Some embodiments of the present disclosure also include packaged semiconductor devices 160 that have been packaged with or include the novel semiconductor devices 140 described herein.

Advantages of some embodiments of the disclosure include providing novel semiconductor devices 140 wherein conductive bumps 134 coupled to the contact pads 106 and the UBM structures 128 have a low resistance, improving the performance of the semiconductor devices 140. The cleaning process 120 comprises a novel substrate 100 treatment that cleans the contact pad 106 top surface and results in a well-controlled conductive bump 134 resistance, even for advanced semiconductor devices 140 having smaller openings 118 in the insulating materials 114, and which may comprise openings 118 as small as about 15 to 30 μm, for example.

Resistance (Rc) values of about 10 milliohms (mOhms) or less for the conductive bumps 134 are advantageously achievable by embodiments of the present disclosure. Experimental results of semiconductor devices 140 manufactured with oval-shaped openings 118 having dimensions of about 15×30 μm resulted in an Rc mapping with a mean bump 134 resistance (Rc) of 2.56 mOhms and with a sigma of 0.62 for a plurality of the semiconductor devices 140 formed across a surface of a substrate 100, as one example. Thus, improved bump 134 Rc performance is achievable by the use of embodiments of the present disclosure.

A bake process to prepare the contact pads 106 for the formation of the UBM structures 128 can advantageously be eliminated or avoided by the novel cleaning processes 120 for the contact pads 106 described herein. The novel cleaning process 120 comprises a single wet cleaning process for the semiconductor device 140 structure and manufacturing methods. The cleaning process 120 for the contact pads 106 that results in improved Rc performance for the conductive bumps 134 is easily implementable in packaging and manufacturing process flows.

In accordance with some embodiments of the present disclosure, a method of manufacturing a semiconductor device includes forming a plurality of contact pads over a substrate, and forming an insulating material over the plurality of contact pads and the substrate. The insulating material is patterned to form an opening over each of the plurality of contact pads, and the plurality of contact pads is cleaned. The method includes forming a UBM structure over the plurality of contact pads and portions of the insulating material. Cleaning the plurality of contact pads recesses a top surface of each of the plurality of contact pads.

In accordance with other embodiments, a semiconductor device includes a substrate and a plurality of contact pads disposed over the substrate. Each of the plurality of contact pads comprises a top surface. The top surface of each of the plurality of contact pads includes a recessed portion and a non-recessed portion. An insulating material is disposed over the substrate and non-recessed portions of the top surface of each of the plurality of contact pads. A UBM structure is disposed over the recessed portion of the top surface of each of the plurality of contact pads and over portions of the insulating material.

In accordance with other embodiments, a semiconductor device includes a substrate and a plurality of contact pads disposed proximate a top surface of the substrate. Each of the plurality of contact pads includes a top surface having a recessed portion. An insulating material is disposed over the substrate and disposed over a non-recessed portion of each of the plurality of contact pads. A UBM structure is disposed over the recessed portion of each of the plurality of contact pads and portions of the insulating material. A conductive bump is coupled to the UBM structure over each of the plurality of contact pads.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a conductive feature embedded in a first dielectric layer over a substrate, the conductive feature having a first width, the first width being measured between outermost surfaces of the conductive feature in a first direction, the first direction being parallel to a top surface of the substrate;
   a second dielectric layer over the first dielectric layer and at least a portion of a top surface of the conductive feature, the second dielectric layer having inner sidewalls over the top surface of the conductive feature, the inner sidewalls of the second dielectric layer being separated from each other by a second width, the second width being measured in the first direction, the second width being less than the first width;
   a contact pad having a first portion disposed over the second dielectric layer and a second portion extending through the second dielectric layer to contact the conductive feature, the second portion of the contact pad being between and contacting the inner sidewalls of the second dielectric layer, the contact pad comprising a top surface and sidewalls, the top surface of the contact pad including a first recessed portion, a second recessed portion, and a non-recessed portion, the first recessed portion being recessed from the non-recessed portion, the second recessed portion being further recessed from the first recessed portion, the first recessed portion, the second recessed portion, and the non-recessed portion being between the sidewalls, the second recessed portion of the top surface of the contact pad being level with a top surface of the second dielectric layer, the contact pad having a third width, the third width being measured between the sidewalls of the contact pad in the first direction, the third width being greater than the first width;
   a first insulating material disposed over the substrate and the non-recessed portion of the top surface of the contact pad, the first insulating material having a uniform thickness over the contact pad and the second dielectric layer, the first insulating material having inner sidewalls over the non-recessed portion of the contact pad, the inner sidewalls of the first insulating material being separated from each other by a fourth width, the fourth width being measured in the first direction, the fourth width being less than the first width and greater than the second width, wherein the first insulating material contacts the non-recessed portion;
   a second insulating material disposed on the first insulating material, wherein the second insulating material has a different material composition than the first insulating material, the second insulating material comprising a polymer, the second insulating material having a non-uniform thickness over the contact pad and the first insulating material, wherein the second insulating material extends through the first insulating material and contacts the first recessed portion and the non-recessed portion of the contact pad;
   an under-ball metallization (UBM) structure extending through the first and second insulating materials to contact the second recessed portion of the contact pad, the UBM structure extending along a top surface of the second insulating material;
   a conductive bump over and contacting the UBM structure, the conductive bump comprising a metal pillar and a solder bump on the metal pillar, the metal pillar contacting the UBM structure, the metal pillar having a fifth width, the fifth width being measured between outermost surfaces of the metal pillar in the first direction, the fifth width being less than the third width and greater than the second width, the solder bump having a sixth width, the sixth width being measured between outermost surfaces of the solder bump in the first direction, the sixth width being greater than third width; and
   a second substrate comprising a conductive trace being bonded to the conductive bump with the solder bump, the conductive trace having a seventh width, the seventh width being measured between outermost surfaces of the conductive trace in the first direction, the seventh width being less than the sixth width.

2. The semiconductor device according to claim 1, wherein the second insulating material has an opening, the UBM structure extending through the opening, wherein the opening comprises a width of about 100 μm or less in a top view of the semiconductor device.

3. The semiconductor device according to claim 1, wherein the second insulating material has an opening, the UBM structure extending through the opening, wherein the opening comprises a round, oval, or polygon shape in a top view of the semiconductor device.

4. The semiconductor device according to claim 1, wherein the second insulating material comprises a thickness of about 3 to 10 μm.

5. The semiconductor device according to claim 1, wherein the UBM structure comprises a plurality of layers, and wherein the plurality of layers comprises a material stack selected from the group consisting essentially of Ti/Cu, TiN/Cu, TaN/Cu, TiW/Cu, Ti/NiV/Cu, Ti/NiSi/Cu, Al/NiV/Cu, Al/NiSi/Cu, and combinations thereof.

6. The semiconductor device according to claim 1, wherein the UBM structure comprises a thickness of about 100 to 10,000 Angstroms.

7. The semiconductor device of claim 1, wherein the seventh width is equal to the third width.

8. The semiconductor device of claim 1, wherein the UBM structure has an eighth width, the eighth width being measured between the outermost surfaces of the UBM structure in the first direction, the eighth width being equal to the fifth width.

9. A semiconductor device, comprising:
a plurality of conductive features embedded in a first dielectric layer over a substrate, each of the plurality of conductive features having a first width the first width being measured between outermost surfaces of the conductive feature in a first direction, the first direction being parallel to a top surface of the substrate;
a second dielectric layer over the first dielectric layer and at portions of top surfaces of the plurality of conductive features, the second dielectric layer having pairs of inner sidewalls over the top surfaces of the plurality of the conductive feature, a first pair of the inner sidewalls of the second dielectric layer being separated from each other by a second width, the second width being measured in the first direction, the second width being less than the first width;
a plurality of contact pads extending over the second dielectric layer and the plurality of conductive features, each of the plurality of contact pads comprising a top surface and side surfaces, each of the top surfaces extending from one side surface to another side surface, each of the top surfaces having a first recessed portion, a second recessed portion, and a non-recessed portion, the first recessed portion being recessed from the non-recessed portion, the second recessed portion being recessed from the first recessed portion, the second recessed portion being level with a top surface of the second dielectric layer, each of the plurality of contact pads having a third width, the third width being measured between the side surfaces of the contact pad in the first direction, the third width being greater than the first width;
a first insulating material disposed over the substrate and contacting the non-recessed portion of at least one of the plurality of contact pads, the first insulating material being a conformal layer, the first insulating material having inner sidewalls over the non-recessed portion of the at least one of the plurality of contact pads, the inner sidewalls of the first insulating material being separated from each other by a fourth width, the fourth width being measured in the first direction, the fourth width being less than the first width and greater than the second width;
a second insulating material disposed over and contacting the first insulating material, wherein the second insulating material has a different material composition than the first insulating material, the second insulating material being a non-conformal layer, the second insulating material comprising a polymer, the second insulating material contacting the first recessed portion and the non-recessed portion of the at least one of the plurality of contact pads;
an under-ball metallization (UBM) structure disposed over and contacting the second recessed portion of the at least one of the plurality of contact pads, the UBM structure contacting the second insulating material; and
a conductive bump coupled to the UBM structure over the at least one of the plurality of contact pads, the conductive bump comprising a metal pillar and a solder bump, the solder bump comprising a material selected from the group consisting essentially of Sn, Sn/Ag, Sn/Cu, Sn/Ag/Cu, Sn/Pb, Au, Ag, Pd, and combinations thereof, the metal pillar being interposed between the solder bump and the UBM structure, the metal pillar having a fifth width, the fifth width being measured between the outermost surfaces of the metal pillar in the first direction, the fifth width being less than the third width, the solder bump having a sixth width, the sixth width being measured between outermost surfaces of the solder bump in the first direction, the sixth width being greater than third width.

10. The semiconductor device according to claim 9, wherein the conductive bump is spaced apart from an adjacent conductive bump by about 150 µm or less.

11. A packaged semiconductor device including the semiconductor device according to claim 9, wherein the substrate comprises a packaging substrate, wherein the semiconductor device comprises a packaging device, and wherein the packaged semiconductor device includes an integrated circuit die coupled to conductive bump of the packaging device.

12. A packaged semiconductor device including the semiconductor device according to claim 9, wherein the substrate includes an integrated circuit die, and wherein the packaged semiconductor device includes a packaging device coupled to conductive bumps of the semiconductor device.

13. The semiconductor device of claim 9, wherein the non-recessed portion has a second thickness, the difference between the first thickness and the second thickness being about 600 Angstroms.

14. The semiconductor device of claim 9 further comprising:
a second substrate comprising a conductive trace being bonded to the conductive bump with the solder bump, the conductive trace having a seventh width, the seventh width being measured between outermost surfaces of the conductive trace in the first direction, the seventh width being less than the sixth width.

15. The semiconductor device of claim 14, wherein the seventh width is equal to the third width.

16. A semiconductor device comprising:
a conductive feature embedded in a first dielectric layer over a substrate, the conductive feature having a first width, the first width being measured between outermost surfaces of the conductive feature in a first direction, the first direction being parallel to a top surface of the substrate;
a second dielectric layer over the first dielectric layer and at least a portion of a top surface of the conductive feature, the second dielectric layer having inner sidewalls over the top surface of the conductive feature, the inner sidewalls of the second dielectric layer being separated from each other by a second width, the second width being measured in the first direction, the second width being less than the first width;
a contact pad a first portion disposed over the second dielectric layer and a second portion extending through the second dielectric layer to contact the conductive feature, the second portion of the contact pad being between and contacting the inner sidewalls of the second dielectric layer, the contact pad having a top surface and side surfaces, the top surface including a first surface, a second surface, and a third surface, the second surface being recessed into the contact pad from the first surface, the third surface being recessed into the contact pad from the second surface, the side surfaces extending from the first surface towards the substrate, the first, the second, and the third surfaces being between the side surfaces, the third surface of the contact pad being level with a top surface of the second dielectric layer, the contact pad having a third width, the third width being measured between the side surfaces of the contact pad in the first direction, the third width being greater than the first width;

a passivation layer on a top surface of the substrate and contacting the first surface of the top surface of the contact pad, the passivation layer being a conformal layer, the passivation layer having inner sidewalls over the first surface of the contact pad, the inner sidewalls of the passivation layer being separated from each other by a fourth width, the fourth width being measured in the first direction, the fourth width being less than the first width and greater than the second width; and a polymer layer on the passivation layer, the polymer layer extending through the passivation layer and contacting the first surface and the second surface of the top surface of the contact pad, the polymer layer having a planar top surface and a non-planar bottom surface, the non-planar bottom surface contacting a top surface of the passivation layer;

an under-ball metallization (UBM) extending through the polymer layer and contacting the third surface of the top surface of the contact pad, wherein the UBM extends along a top surface of the polymer layer;

a conductive bump coupled to the UBM, the conductive bump having a fifth width, the fifth width being measured between the outermost surfaces of the conductive bump in the first direction, the fifth width being greater than the third width; and a second substrate comprising a conductive trace being bonded to the conductive bump with a solder bump, the conductive trace having a sixth width, the sixth width being measured between outermost surfaces of the conductive trace in the first direction, the sixth width being less than the fifth width.

17. The semiconductor device of claim 16, wherein the first surface of the top surface of the contact pad surrounds the second surface of the top surface of the contact pad.

18. The semiconductor device of claim 16, wherein the UBM comprises a plurality of layers, and wherein the plurality of layers comprises a material stack selected from the group consisting essentially of Ti/Cu, TiN/Cu, TaN/Cu, TiW/Cu, Ti/NiV/Cu, Ti/NiSi/Cu, Al/NiV/Cu, Al/NiSi/Cu, and combinations thereof.

19. The semiconductor device of claim 16, wherein the first surface and the second surface of the contact pad are parallel to each other.

20. The semiconductor device of claim 16, wherein the first surface and the second surface are parallel to a major surface of the substrate.

21. The semiconductor device of claim 16, wherein the conductive bump comprises a metal pillar and a solder bump on the metal pillar, the metal pillar contacting the UBM, the metal pillar having a seventh width, the seventh width being measured between outermost surfaces of the metal pillar in the first direction, the seventh width being less than the third width and greater than the second width, the solder bump having the fifth width, the fifth width being measured between outermost surfaces of the solder bump in the first direction.

* * * * *